United States Patent [19]
Wingender et al.

[11] Patent Number: 5,471,210
[45] Date of Patent: Nov. 28, 1995

[54] ANALOG DIGITAL CONVERTER

[75] Inventors: Marc Wingender, Grenoble; Stéphane Le Tual, St Egreve, both of France

[73] Assignee: Thomson-CSF Semiconducteurs Specifiques, Paris, France

[21] Appl. No.: 151,852

[22] Filed: Nov. 15, 1993

[30] Foreign Application Priority Data

Dec. 4, 1992 [FR] France .................... 92 14640

[51] Int. Cl.$^6$ .................................. H03M 1/34
[52] U.S. Cl. ............................ 341/156; 341/159
[58] Field of Search .................... 341/155, 156, 341/158, 159

[56] References Cited

U.S. PATENT DOCUMENTS

| | | |
|---|---|---|
| 4,058,806 | 11/1977 | Nadler . |
| 4,297,679 | 10/1981 | Arbel et al. ............... 341/156 |
| 5,126,742 | 6/1992 | Schidt et al. ............... 341/156 |
| 5,151,700 | 9/1992 | Matsuzawa et al. ........ 341/156 |

FOREIGN PATENT DOCUMENTS

| | | |
|---|---|---|
| 0227165 | 7/1987 | European Pat. Off. . |
| 0302553 | 7/1988 | European Pat. Off. . |
| 0414389 | 2/1991 | European Pat. Off. . |
| 9208288 | 5/1992 | WIPO . |

*Primary Examiner*—Howard L. Williams
*Attorney, Agent, or Firm*—Oblon, Spivak, McClelland, Maier & Neustadt

[57] ABSTRACT

The invention concerns precision analogue-digital converters. For the fine conversion, supplying the low order bits (B0 to Bk) for an analogue voltage Vin to be converted, three ordinary differential amplifiers (ADA, ADB, ADC) are used connected to three voltage references VR(i–1), VR(i), VR(i+1). These three amplifiers supply differential output voltages (VAa, VAb, VBa, VBb, VCa, VCb) that vary as a function of Vin according to normal transfer functions for differential amplifiers. Intersection points of these various transfer curves are detected in interpolation circuits (firstly CIT1, then CIT2, etc). These intersection points are used as intermediate voltage references between the main references. Comparators (CMP0 . . . CMPk), placed at the output of interpolation circuits supply bits (B0 to Bk) indicating the value of Vin with respect to each of these intermediate references.

12 Claims, 5 Drawing Sheets

ANALOG DIGITAL CONVERTER

BACKGROUND OF THE INVENTION

1. Field of the Invention

The invention concerns analogue-digital converters, in other words electronic circuit capable of converting an analogue input signal into a precise digital value representing the amplitude of the analogue signal. The digital value is obtained in the form of a word containing several bits, generally coded in pure binary.

2. Description of the Prior Art

There are several conversion procedures, and the choice of one procedure rather than another depends on the performances required from the converter. The most important parameters for these performances are:

- the resolution, defined by the number of bits in the output word precisely representing the amplitude of the analogue signal; the number of bits may be 16 or 18, or even 20 for the most accurate converters, and the precision is generally + or −½ of the least significant bit;
- the speed, in other words the number of conversion operations that can be done in one second;
- the power consumption; a fast and accurate converter consumes much more energy than a slow and inaccurate converter; the power consumption increases the temperature of the chip in the integrated circuit on which the converter is made. This temperature rise must be compensated by cooling equipment that make the circuit difficult to use when there are dimensional constraints to be respected;
- and obviously the cost of design and manufacture of the converter, in particular related to the surface area of the chip in the integrated circuit used by the converter.

The qualities of an analogue-digital-converter are the result of a compromise between the above parameters, and the purpose of this invention is to improve this compromise.

Some known analogue-digital converter structures are:

- successive approximation converters that successively compare the input analogue signal Vin with digital values that get a little closer to the value of the analogue signal on each iteration; these converters work in at least N phases if the value is coded on N bits; they are therefore generally very slow for precisions exceeding 6 or 8 bits.
- "flash" converters that use $2^N$ comparators in parallel; each comparator receives firstly the analogue signal, and secondly one of the $2^N$ reference voltages defined by a bridge of $2^N$ precision resistances; these converters are very fast (generally 2 phases) but they are very large and consume a large amount of power when N is equal to 10 or 12 bits;
- combined converters with a coarse converter to obtain high order bits and a fine converter to obtain low order bits; the coarse converter may be fast and imprecise (for example 4 to 6 bits), whereas the fine converter must be precise even if it is slower.

Several solutions have already been put forward for combined converters.

In one solution, the coarse converter is a flash converter that supplies the P high order bits. This value is reconverted into an analogue signal by a P-bit digital-analogue converter; the difference between the analogue signal Vin and this reconverted value, also called the remainder or residue, is converted by a fine converter that determines the low order bits of the conversion; this consumes less power and is more compact than a flash converter, but the digital-analogue conversion takes time and requires precise servocontrol of gains in the various parts of the circuit (analogue-digital and digital-analogue converter).

In another combined converter architecture, an input analogue signal "folding" converter is used; the input signal Vin is applied to at least two foldback circuits that have the function of supplying "folded" signals Vr1, Vr1b, Vr2, Vr2b having an amplitude that varies with the amplitude of the input signal Vin in accordance with a periodic function (with a near-sinusoidal shape); the period is defined by the difference between the reference voltage values uniformly distributed between two extreme values; the reference voltages are produced by a resistant bridge, and the number of reference voltages used by foldback blocks defines the number of periods of the folded signal in the maximum possible variation range of the input analogue signal. Functions Vr1 and Vr1b are in phase opposition, in other words the signal Vr1b is minimum for the value of Vin for which Vr1 is maximum, and vice-versa. The same is true for Vr2 and Vr2b. Functions Vr1 and Vr2 are 90° out of phase, in other words the folded signal Vr2 is maximum or minimum for the input value Vin for which Vr1 is zero, and vice versa.

Periodic maxima and minima are actually equal to reference voltages used by the foldback circuits, the reference voltages used by the first foldback circuit being regularly alternated with reference voltages used by the second foldback circuit. Differences (Vr1−Vr1b), (Vr2−Vr2b) between folded signals from the two blocks periodically cancel out for values of the input voltage equal to the reference voltages; these differences are used to create "interpolated" signals with the same general shape as the differences between folded signals, but that cancel out for input voltage values intermediate between the reference values.

Thus, starting from an input signal Vin and a series of uniformly distributed reference voltages, at least four folded signals Vr1, Vr1b, Vr2, Vr2b are created, the amplitude of which depends on Vin (but in the form of a periodic function) and several periodic interpolated signals, for which the positive or negative sign depends on the difference between Vin and reference voltage values intermediate between the initial references.

Interpolated signals can then be used to obtain the low order of the digital-analogue conversion representing the position of Vin with respect to these adjacent intermediate reference values. High orders are given by a coarse converter that indicates the folded signal "period" within which the analogue input voltage Vin is located, in other words it indicates the adjacent reference voltage values between which Vin is located. The advantage if this architecture lies in the fact that interpolation circuits receive voltages (differences of folded signals) whose amplitudes depend on the exact value of the input voltage Vin but are independent of the range in which Vin is located. Consequently a single interpolation circuit is sufficient to establish low orders of the conversion, without it being necessary to use a digital-analogue converter, therefore without slowing down the conversion operation and without any gain servocontrol problems.

In an existing architecture, the interpolation circuit consists of single resistance bridges that for example receive the differences (Vr1−Vr2) and (Vr1b−Vr2b) between folded signals. Intermediate taps points on these resistance bridges output interpolated signals; they are applied in pairs to comparators that toggle in one of two directions depending on the value of the interpolated signals and therefore depending on the position of Vin between two adjacent reference voltages.

In another architecture, the interpolation circuit contains several stages in cascade; the first stage receives the four folded signals and combines them to produce four other signals that are still periodic functions of the input analogue voltage Vin, but this time with a period double the period of the folded signals; these new signals pass through zero not only when Vin is equal to the reference voltages used for the foldback, but also for intermediate reference voltages located at the mid-point of the interval between two adjacent reference voltages. Therefore the signals can supply one information bit more than the high order bits obtained by the coarse converter. Voltages thus obtained at the output of the first stage are applied to a second stage that performs the same function (creation of signals with a newly doubled period) and which supplies an additional bit for the value of Vin. Several stages may be put in cascade in this way to obtain the successive low order bits of the conversion. U.S. Pat. No. 5 126 742 would appear to describe an architecture of this type.

Regardless of whether interpolation circuits are parallel interpolation circuits (application of folded signals to resistance bridges) or cascade interpolation circuits, the major disadvantage of input analogue signal foldback architectures is the disadvantage inherent to the circuits that perform the foldback; it is impossible to make a folded signal that is genuinely symmetrical about a mean value.

The operation of interpolation circuits on the output side of foldback circuits is based largely on the very precise symmetry of the four foldback signals. Even a slight asymmetry between the maximum and minimum values of a folded signal will shift intermediate voltage values for which the folded signal differences cancel out. Since these values are used as a reference for the conversion of low orders, this can create conversion errors that may be high.

These symmetry errors may be partially compensated by additional circuits, but this makes the circuit more complex, larger and less reliable.

Signal foldback analogue-digital converters also require a coarse converter to indicate the reference voltage values between which the input voltage is located, and it is difficult to combine information output from the coarse converter with information output from the folded signal interpolation, particularly to take account of cases in which the voltage to be converted is close to the limit between two consecutive digital values output by the coarse converter; it is sometimes necessary to correct the high order bits as a function of the low order bits.

SUMMARY OF THE INVENTION

In order to overcome the disadvantages of known analogue-digital converters and to improve the compromise between the performances of these converters, particularly concerning precision, operating speed, consumption and cost, the invention puts forward a new converter architecture that does not use the foldback circuit for the analogue input signal to be converted; consequently the proposed architecture has at least the advantage that it does not suffer from the disadvantages inherent to these foldback circuits.

The invention is for an analogue-digital converter with one input on which it receives an analogue voltage Vin to be converted, and is distinguished in that it has three main reference voltages VR(i−1), VR(i), VR(i+1) [VR(i) is equidistant from VR(i−i) and VR(i+1) in all cases], and three differential amplifiers each of which receives on a first input the voltage to be converted, Vin, that may vary between two extreme values Vext1 and Vext2 located outside the interval between the main reference voltages, and one of the three main reference voltages on a second input, each amplifier supplying two output voltages that vary symmetrically as a function of the voltage Vin, nearly linearly about an average value Vm that is identical for the three amplifiers and that is obtained as an amplifier output when the voltages on the two inputs to this amplifier are equal, the output voltages also varying monotonically as a function of Vin for values of Vin between the extreme values Vext1 and Vext2, the converter also comprising a first interpolation circuit receiving the six amplifier output voltages and supplying four rank 1 interpolation voltages, variable as a function of Vin according to a function that is near-sinusoidal for values Vin between the main reference voltages, identical in amplitude for the four voltages except for the phase, and representing a single sine period, the four interpolation voltages varying inversely in pairs, two of them passing through a mean value and one of the other two passing through a maximum and the other through a minimum when the voltage Vin is equal to any one of the three main reference values.

In summary, the idea is to create six analogue voltages using ordinary amplifiers (in the sense that they are not input signal foldback amplifiers), then to create four other analogue voltages from these six voltages, the intersections of which define the intermediate reference voltages that are useful for analogue-digital conversion of the initial voltage Vin.

The structure summarized above can create signals by differences, that pass through zero not only when Vin is equal to the three main reference voltages, but also when Vin is equal to the two other intermediate reference voltages (that may be called rank 1 intermediate voltages) at the mid-point between the main reference voltages taken in pairs. This means that the Vin signal can be instantaneously compared, without an input analogue signal foldback circuit, with five reference voltage values. This therefore gives an analogue-digital conversion circuit that can supply a digital code on at least two bits, also with the possibility of identifying when the VR(i−1) and VR(i+1) limits are overrun.

Preferably a rank 0 comparator receives outputs from the differential amplifier connected to the main reference voltage VR(i) and outputs a high order bit of the conversion of Vin. A rank 1 comparator receives two outputs from the first interpolation circuit (also called the rank 1 interpolation circuit); more precisely this comparator receives the two voltages in phase opposition that pass through a maximum or a minimum when Vin is equal to the main references voltages VR(i−1), VR(i), VR(i+1). This comparator output a rank 1 bit of the conversion of Vin.

But it is also very important to note that four voltages are obtained at the output of the rank 1 interpolation circuit that have a generally sinusoidal shape (one period only) as a function of Vin; and these signals pass through an average value (common to the four signals) at clearly determined reference values. These rank 1 interpolation voltages may therefore, if we wish, be used themselves in a rank 2 interpolation circuit that can be used to produce four other rank 2 interpolation voltages (themselves useable in a rank 3 circuit, etc.) identified with respect to four additional rank 2 intermediate reference voltages located at the mid-points between the previous reference voltages (main and intermediate rank 1 voltages). A comparison between the various rank 2 interpolation voltages then gives an additional bit in the analogue-digital conversion of the signal Vin.

Thus several interpolation circuits may be provided, and the number of these circuits will define the number of analogue signal conversion bits.

Consequently, it is preferable that the analogue-digital converter contains at least one rank k (k>1) interpolation circuit receiving four voltages output from a rank k−1 interpolation circuit, and each supplying four rank k interpolation voltages, variable as a function of the amplitude of the signal Vin to be converted using a function which, for values of Vin between the main reference voltages, is near-sinusoidal, identical in amplitude for the four signals except for the phase, and representing $2^{k-1}$ sine periods; the four rank k interpolation voltages varying inversely in pairs; two of them pass through a common average value when the voltage Vin to be converted is equal to "rank k intermediate voltage" values, one passing through a maximum and the other passing through a minimum when the voltage Vin to be converted is equal to the values of the main and intermediate reference voltages of rank 1 to k−1; the other two rank k interpolation voltages pass through a common mean value when the voltage Vin is equal to a main or intermediate reference voltage of rank 1 to k−1.

By creating these four rank k interpolation signals, $2^k$ additional rank k intermediate reference voltages are defined located at the mid-point of intervals between intermediate reference voltages of the various preceding ranks (rank 0 being the main reference voltages).

Consequently, an important advantage of the invention is that it enables an interpolation in series on a number of stages that is theoretically only limited by the capacity of comparators to accurately detect equality of two interpolation signals of a determined rank.

Preferably, a rank k comparator will be provided at the output of a rank k interpolation circuit, more precisely the two voltages in phase opposition that pass through a maximum or a minimum when Vin is equal to rank 0 to k−1 intermediate reference voltages. This comparator outputs a rank k bit of the conversion of Vin.

Another very important advantage of the invention is the fact that this structure is compatible with "combined" converter architectures that use a coarse conversion and a fine conversion. In particular, combined converter structures can be made that very much simplify problems of combining high order bits obtained by the coarse converter and low order bits obtained by the fine converter.

The converter according to the invention could be used as a coarse converter combined with fine converter based on another identical or different structure. However it is believed that a very advantageous structure is that in which the converter according to the invention is used as a fine converter combined with a circuit for the selection of a group of three main reference voltages among more than three main reference voltages, this circuit being capable of comparing the input signal Vin with different reference voltages, of selecting a group of three adjacent main reference voltages such that Vin is between these reference voltages, and setting up the necessary connections between these three reference voltages, three differential amplifiers, and at least one interpolation circuit such as that previously defined according to the invention.

This therefore gives an evaluation of the range of voltages within which Vin lies, followed by a fine analogue-digital conversion by series interpolation inside the selected voltage range.

There may be only three amplifiers for the entire circuit, in which case the range selection circuitry acts to connect the three selected reference voltages with these three amplifiers. Or there may be as many amplifiers as there are possible main reference voltages (each connected to its own amplifier) in which case the range selection circuitry acts to select the outputs from the three amplifiers and to connect them to the rank 1 interpolation circuit.

The composition of an interpolation circuit is preferably essentially as follows: for each group of two interpolation signals to be produced varying symmetrically and inversely, it comprises a cell with three pairs of differential branches, each branch comprising at least one load and an input transistor in which the control electrode (for example the base of a two-pole transistor) forms a signal input for this branch. The two symmetric branches of the first pair are powered by the current from the first branch of the third pair and together form the load for this first branch; the two branches of the second pair are powered by the current from the second branch of the third pair and together form the load for the second branch; the first branches of the first and second pair have a common load, the second branches of the first and second pairs also have a common load symmetric with the other.

This cell is similar to a known multiplier structure called the "Gilbert cell".

For a rank k (k>1) interpolation circuit there are two interpolation cells; in principle the following input signals are applied to the first cell:

the first two rank k−1 interpolation signals varying as a function of Vin in phase opposition, applied as inputs to the first differential pair, these same signals, crossed, applied to the second differential pair, the other two rank k−1 interpolation signals applied to the third differential pair.

Outputs are taken on the common loads of the first and second differential pair and form two rank k interpolation signals.

In principle, the following signals are applied to the second interpolation cell in the rank k interpolation circuit:

a first and second rank k−1 interpolation signal varying 90° out of phase of Vin, applied as input to the first differential pair, the same signals but crossed, applied to the inputs of the second differential pair, a third rank k−1 interpolation signal, varying in phase opposition with the first, is applied to an input of the third differential pair, the second rank k−1 interpolation signal being applied to the other input of the third pair.

The outputs from this second cell, tapped from the loads common to the first and second differential pair, form the other two rank k interpolation signals.

For the rank 1 interpolation circuit, there are also two interpolation cells made up in the same way each with three pairs of differential branches.

The first cell receives:

on the first differential pair, output signals from the first differential amplifier varying in phase opposition to Vin, and cancelling out when Vin is equal to the first main voltage reference VR(i−1);

on the second differential pair, output signals from the third amplifier varying in phase opposition and cancelling out when Vin is equal to the third main voltage reference VR(i+1);

on the third differential pair, output signals from the second amplifier, also varying in phase opposition and cancelling out for the second voltage reference VR(i). The second cell receives:

on the first differential pair, an output from the third amplifier and an output from the second, on the second differential pair, the same signals but crossed, on the third pair, firstly an output from the first amplifier, and secondly an output from the second amplifier.

Outputs from this rank 1 interpolation circuit are tapped from loads common to the first and second differential pairs on each cell.

BRIEF DESCRIPTION OF THE DRAWINGS

Other characteristics and advantages of the invention will become clear by reading the detailed description below with reference to the drawings in the appendix in which.

DESCRIPTION OF PREFERRED EMBODIMENTS

Figure 1:
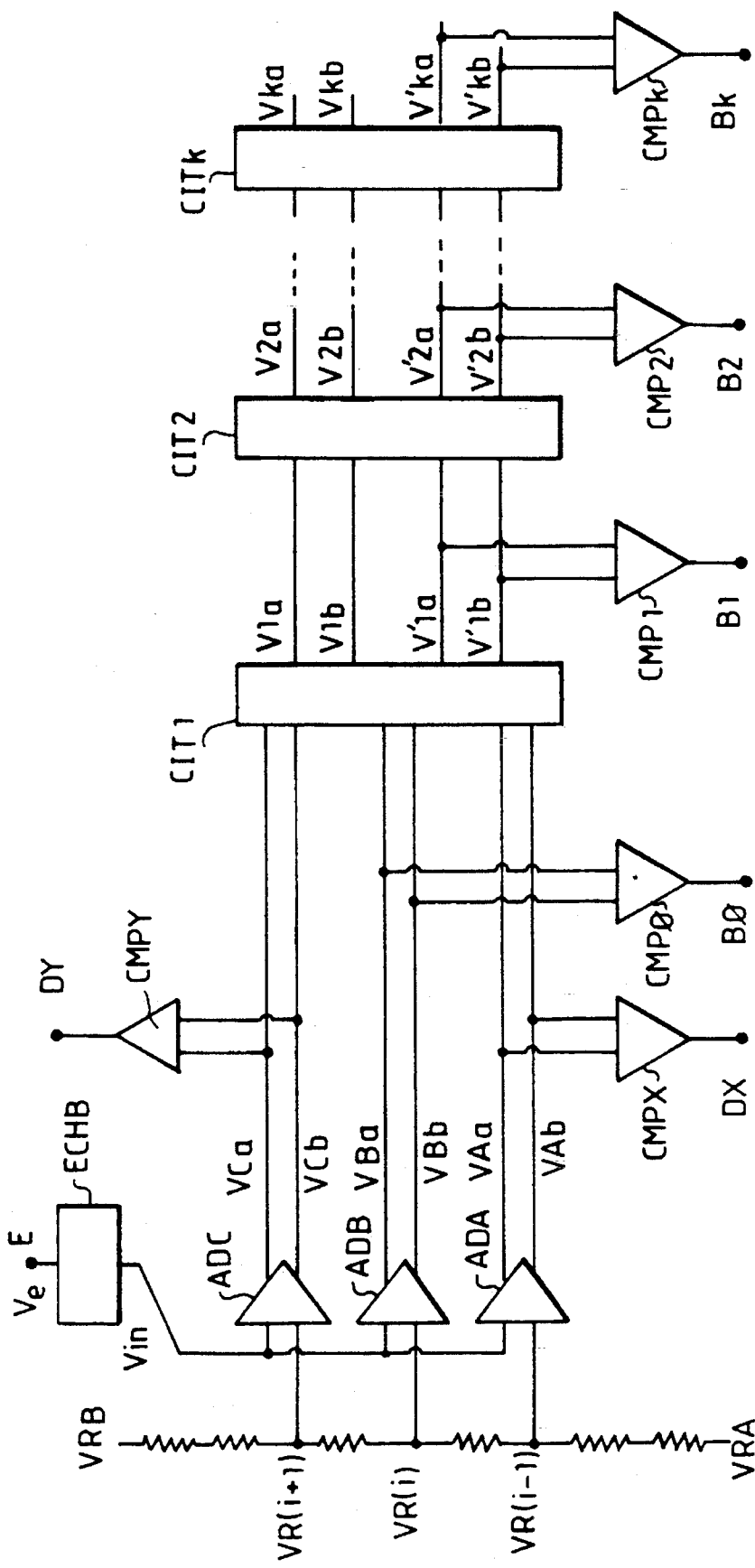
FIG. 1 represents the basic schematic composition of an analogue-digital converter according to the invention.

The general structure of the converter according to the invention is shown in FIG. 1. The function of this converter is to output a digital signal containing m bits representing in digital form the value of the amplitude of an input analogue signal Vin. The m bits contain a binary code representing one value of Vin among $2^m$ values uniformly distributed between two main reference values VR(i−1) and VR(i+1).

The input signal Vin can be equal to any value between the two extreme values Vext1 and Vext2 that may be outside the range of values between VR(i−1) and VR(i+1), but in all cases the output from the converter only supplies a digital representation of Vin if Vin is between VR(i−1) and VR(i+1). However it will be seen that the converter can also output an overrun or underrun signal indicating if Vin is outside the range VR(i−1) to VR(i+1).

The main reference voltages VR(i−1) and VR(i+1), and another main reference voltage VR(i) equidistant from the values VR(i−1) and VR(i+1) are applied to the first input of a differential amplifier ADA [for VR(i−1)], ADB [VR(i)] and ADC [VR(i+1)].

Reference voltages are produced arbitrarily, but preferably using a precision resistance bridge powered between two global reference voltages VRA and VRB; intermediate taps on this bridge are designed to obtain the main reference voltages VR(i−1), VR(i) and VR(i+1).

Each differential amplifier has a second input to which the input voltage Vin to be converted is applied. This voltage is preferably obtained from the output of an ECHB sampler-blocker; the output voltage Vin periodically reproduces the value of the voltage Ve at the sampler input E and keeps it constant between two successive sampling instants. In the following it will be considered that this voltage Vin forms the converter input signal although the analogue signal to be converted is actually controlled by the signal Ve.

The sampler-blocker ECHB keeps the value of the signal to be converted constant for sufficient time for the analogue-digital conversion to be completely terminated.

The differential amplifiers ADA, ADB, ADC are identical. The special properties of their transfer function (function representing how their output voltages change as a function of their input voltages) are described below. But we can already state that these special properties are obtained using standard amplifiers, consisting in their simplest version for example of a pair of differential branches globally powered by a constant current source, with an input transistor and a resistive load in each branch. Therefore these are not fold-back circuits for the input signal Vin to be converted.

Each amplifier has two differential outputs. It supplies two voltages on these outputs that vary symmetrically as a function of the value of Vin, near-linearly around a minimum value Vm, common for the two outputs and identical for the three amplifiers; this common average value is the value obtained at the output from an amplifier when the voltages on the two inputs to this amplifier are equal. Moreover, the amplifiers are such that the output voltages on the differential outputs vary monotonically with Vin throughout the range of possible values of Vin (within the interval VR(i−1) to VR(i+1) and beyond in the interval Vext1 to Vext2 of possible values of Vin).

Figure 2:
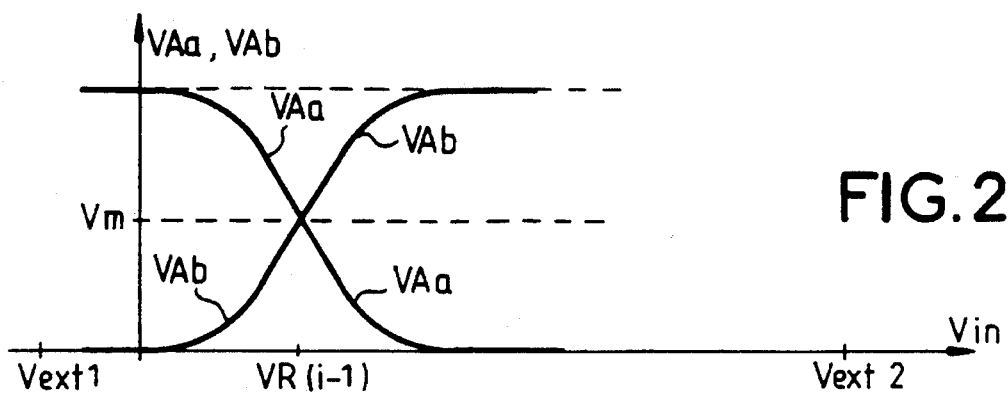
FIGS. 2 to 5 represent curves showing the variation of output voltages from amplifiers and interpolation circuits as a function of the analogue voltage Vin to be converted.
Figure 3:
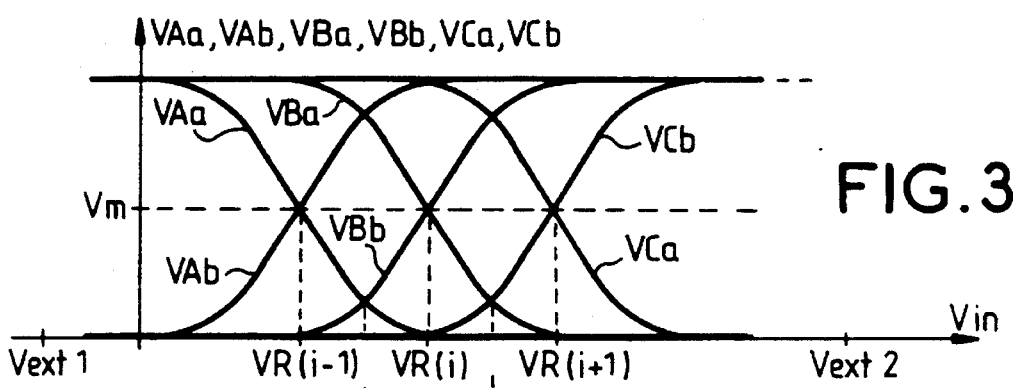

FIG. 2 shows the values of the two differential output voltages (VAa, VAb) for a single amplifier (ADA); FIG. 3 shows superimposed the six output voltages corresponding to the three amplifiers—(VAa, VAb) for ADA, (VBa, VBb) for ADB, (VCa, VCb) for ADC. The curves show how these voltages (VAa, VAb, VBa, VBb, VCa, VCb) vary as a function of the value of the input voltage Vin, rather than their wave shapes with time.

Curves VAa and VAb in FIG. 2 represent classical transfer functions of a single symmetric differential amplifier with two input transistors with one input at reference voltage VR(i−1), and the other input at Vin. Curves VAa and VAb are symmetric and monotonic and they intersect at a point with abscissa VR(i−1) and ordinate Vm, where Vm is the value of the common potential of outputs for a zero differential input voltage, in other words when the input voltage Vin applied to an input is equal to the reference, Vr(i−1) in this case, applied to the other input.

Portions of curves around the point at which they intersect are near-linear, then as the distance from this point increases, the curve tends asymptotically towards two extreme values of the potential that depend on the amplifier polarization voltages and currents. The slopes of the near-linear portions are lower if an emitter resistance is placed in series with the transmitter emitter in each differential branch of the amplifier. The linearity of the near-linear part is also improved with this type of emitter resistance and it may therefore be useful to fit emitter resistances on the differential amplifiers. However perfect linearity is not necessary; the important quality parameters are that the mean value Vm is equal for the three amplifiers and that the curves for the three amplifiers are parallel.

FIG. 3 shows curves for the three amplifiers. These curves are identical but are laterally shifted with respect to each other since they are centered on three different reference voltages VR(i−1), VR(i) and VR(i+1).

These curves show that information can be obtained at the output from the second amplifier about whether or not Vin is greater than VR(i). The difference between signals VBa and VBb is positive if Vin is less than VR(i), and negative if Vin is greater than VR(i). A simple comparator CMP0 (rank 0 comparator) with two inputs receiving the two outputs from the second amplifier, provides a bit B0 (rank 0 bit) at its output containing digital information showing if Vin is above or below VR(i).

Similarly if required, a comparator CMPX may be provided receiving outputs from the first amplifier, ADA, to provide a logical underrun signal DX [Vin<VR(i−1)], and a comparator CMPY may be provided receiving outputs from the third amplifier to provide a logical overrun signal DY [Vin>VR(i+1)].

It can be seen on the curves in FIG. 3 that curves VAa and VBb intersect exactly at the mid-point of the interval between VR(i−1) and VR(i). The same is true of curves VBa and VAb. Similarly, the intersection of curves VBb and VCa, or curves VBa and VCb, is located at exactly the mid-point of the interval VR(i) and VR(i+1). Therefore using the corresponding amplifier outputs, it is possible to determine if Vin is above or below the intermediate reference voltages defined by these curve intersections.

For example a comparator receiving outputs VAa and VBb supplies a logical signal indicating if Vin is greater than or less than the intermediate intersection voltage between VAa and VBb. The sign of VAa−VBb detected by this comparator is positive if Vin is greater than the intermediate voltage, or is negative otherwise. We can thus obtain the value of Vin with a code on two bits, by comparison with five reference voltages, namely the main reference voltages VR(i−1), VR(−i) and VR(i+1) and two intermediate reference voltages that are the mid-points of intervals between the main reference voltages.

However it is preferred to use a more complex solution that can give a digital code on more than 2 bits.

This is done by applying the six analogue output signals from amplifiers ADA, ADB, ADC to the inputs of a first circuit CIT1 that will be called the "first interpolation circuit" because its function is to establish signals that will be used to define the fictitious intermediate reference voltages mentioned previously. These intermediate reference voltages are obtained by interpolation between the main reference voltages. They will be called rank 1 intermediate reference voltages, and we will see that other intermediate reference voltages of ranks 2, 3, etc. can be created later, each time located at the mid-point of the interval between two adjacent reference voltages forming part of the previous ranks (rank 0 being the rank of the main reference voltages).

The first interpolation circuit CIT1 therefore produces analogue signals that can fictitiously establish rank 1 intermediate reference voltages, but its function is also to ensure that analogue signals may themselves be transmitted to an interpolation circuit of the next rank that will play a similar role.

In the same way that curves VAa, VAb as a function of Vin intersect when Vin is equal to a main reference voltage and in the same way that curves VAa and VBb intersect when Vin is equal to the rank 1 intermediate voltage, we will use circuit CIT1 to produce:

firstly two symmetric signals V1a and V1b that intersect each time that Vin is equal to the main reference voltages;

secondly two symmetric signals V'1a and V'1b that intersect each time that Vin is equal to the intermediate reference voltages; curves V'1a and V'b are identical in amplitude and in shape to curves V1a and V1b but are shifted since the intersection points are not at the same locations.

The result is then that curve V1a intersects curves V'1a and V'1b for new intermediate reference voltages located at the mid-point of the intervals defined by the previous reference voltages (main or rank 1 intermediaries). These new fictitious references are called rank 2 intermediate voltages.

In order to produce analogue signals that periodically intersect at the location of the three main voltage references, a double differential structure is used of the same type as Gilbert cells used under other circumstances as frequency multipliers. These structures are composed essentially of two pairs of differential branches each powered by one branch in a third differential pair, rather than by a fixed current as in the case of a simple amplifier. Each differential branch has a differential input and on this input receives two input signals taken among the signals whose transfer functions intersect. The outputs from the first two differential pairs are connected together and form the outputs from the structure.

These output signals are equal whenever any one of the three differential inputs passes through zero. Thus if we apply:

the signals VAa and VAb which intersect for Vin equal to VR(i−1), at the differential inputs of the first pair;

the signals VCa and VCb that intersect for Vin=VR(i+1), at the inputs of the second pair;

and signals VBa and VBb that intersect for Vin=VR(i) at the inputs of the third pair, we then obtain two output signals V1a and V1b that are equal whenever Vin is equal to one of the three main reference voltages.

The shape of the variation curve for signals V1a and V1b is then generally the approximate shape of a single sine period starting from Vin=VR(i−1), terminating for Vin=VR(i+1), and passing through a maximum or minimum for rank 1 intermediate voltage values located at the mid-point between the main reference voltages. Voltages V1a and V1b are symmetrical, in other words one increases when the other decreases and vice versa.

Figure 4:
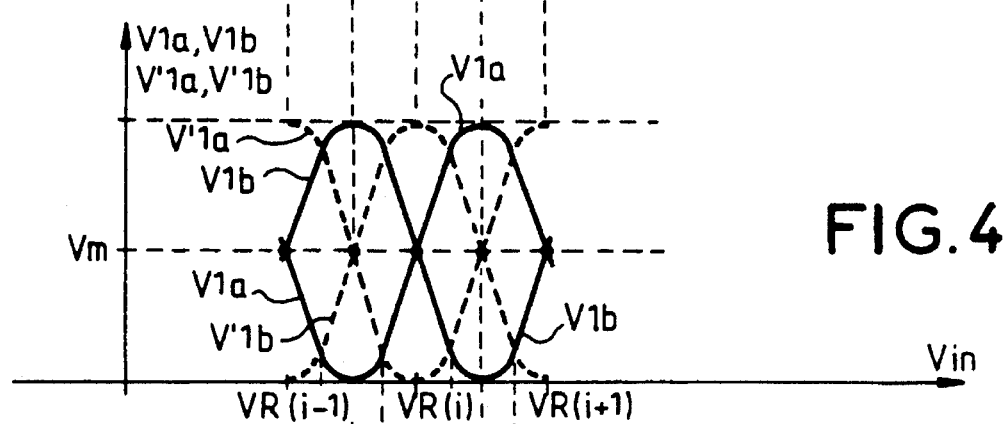

This is shown in FIG. 4 in which near-sine curves V1a and V1b are shown in solid lines. The shape of these curves is not mathematically sinusoidal but this is not important provided that the curves are symmetrical and provided that they are identical (except for phase shift) in amplitude and in shape to curves V'1a and V'1b that will also be produced by circuit CIT1.

In order to produce signals V'1a and V'1b, circuit CIT1 includes another cell of the same type as that described above, in other words a cell with three pairs of differential branches, but signal pairs that intersect for rank 1 intermediate voltages are chosen as differential input signals instead of those that intersect for main reference voltages.

Thus VAb and VBa signals intersect for the first rank 1 intermediate voltage; they will be applied to the input of a differential pair; similarly the VBa and VCb signals are equal for the second rank 1 intermediate voltage; they will be applied to the input of another differential pair; the last of the three differential pairs can receive the same signals VBa and VCb, or VAb and VBa, or other pairs of signals intersecting at intermediate reference voltages.

FIG. 4 shows signals V'1a and V'1b in dotted lines, that have the same shape and amplitude as V1a and V1b but the intersections are located at the mid-point of intervals between the main reference voltages. These signals also each represent a single near-sine curve between the main voltage references, they are symmetrical and have maxima and minima at the main reference voltage values.

We can already see that curves V1a and V1b intersect curves V'1a and V'1b for values of intermediate voltage Vin located at the mid-points between the previously defined reference voltages. These new reference voltages, fictitious since they are not materialized in the circuit, will be rank 2 intermediate reference values.

The shape of curves V1a, V1b, V'1a, V'1b is not important outside the VR(i−1), VR(i+1) interval.

The average value of signals V1a, V1b, V'1a, V'1b is the same for the four signals, but does not need to be the same value Vm as for signals VAa, VAb, etc. However Vm is shown on FIG. 4 in order to simplify the notation.

A comparator CMP1 (rank 1 comparator) can be connected to the output from the first interpolation circuit CIT1, receiving signals V'1a and V'1b and indicating where Vin is located with respect to rank 1 intermediate voltages; the sign of V'1a–V'1b changes each time that Vin passes through a rank 1 intermediate voltage, but does not change for other values of Vin. Therefore the comparator CMP1 supplies an additional information bit B1 (rank 1 bit). We will see later that the binary code obtained by bits B0, B1, etc., and representing the digital value of the analogue signal Vin is a Gray code, and is not a conventional pure binary code.

In order to continue the digital coding of the analogue signal, we will successively repeat the operation transforming the pair of symmetrical signals that have rank 1 intermediate voltages as intersection points and the pair of symmetrical signals with rank 0 main reference voltages as intersection points, into two pairs of symmetrical signals one of which has intermediate voltages of previous ranks (0 or 1) as intersection points, and the other has intermediate voltages of rank 2 that are the mutual intersection points of a signal from a pair of input signals with the two signals of the other pair, as intersection points.

More generally, several interpolation circuit CIT2, CIT3, of rank 2, 3, etc., can be put in cascade, the rank k interpolation circuit receiving as input signals a first pair of symmetric signals V(k−1)a and V(k−1)b that intersect for ranks 0 to k−2 reference voltages, and a second pair of symmetric signals V'(k−1)a and V'(k−1)b that are 90° out of phase from the first pair and that intersect for rank k−1 reference voltages, these two pairs being output signals from the previous rank k−1 interpolation circuit; using these signals, the rank k interpolation circuit produces a first pair of symmetric output signals with all rank 0 to k−1 reference voltages as intersection points, and the intersection points of the second pair are rank k reference voltages located at the mid-point of intervals between previous rank references, and which are the intersection points of values of a signal from one of the pairs of input signals with the two signals in the other pair.

Figure 5:
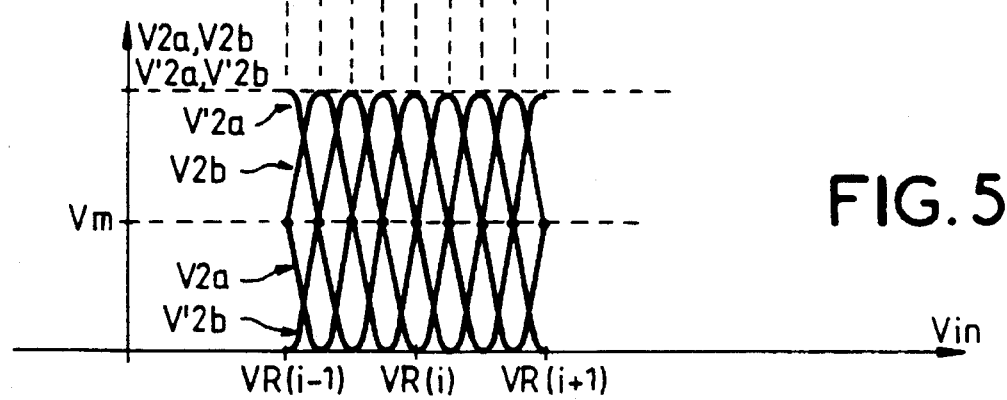

This is shown in FIG. 5 showing curves representing values of output signals from the second interpolation circuit CIT2, as a function of Vin.

The first pair of symmetric output signals V2a and V2b intersect at values of the main and rank 1 intermediate reference voltages; the second pair V'2a, V'2b has its maxima and minima respectively at these same points. And the mutual intersection of the pair V2a and V2b with pair V'2a, V'2b defines the rank 2 intermediate reference voltages.

As can be seen in FIG. 5, the signals output from the rank 2 circuit are approximately sinusoidal in shape between reference values VR(i−1) and VR(i+1) and each covers exactly two periods. Signals output from the rank k circuit cover $2^{k-1}$ periods. The shape of these curves is not important outside the range VR(i−1) to VR(i+1).

A rank 2 comparator CPM2 is placed at the output of circuit CIT2 receiving V'2a and V'2b that intersect for rank 2 intermediate reference voltages, and this comparator outputs a rank 2 bit B2 specifying the position of the voltage Vin with respect to these voltages. Similarly, a rank k comparator CMPk receiving signals V'ka and V'kb output from the rank k interpolation circuit, outputs a rank k bit Bk specifying the position of Vin with respect to the rank k intermediate voltages.

We have thus described the general structure of the converter according to the invention. The digital output is made up of bits B0 . . . Bk. These bits are coded using a Gray code, in other words a code in which increasing (or decreasing) values of Vin correspond to successive binary codes such that only one bit changes state whenever Vin increases or reduces by a sufficient quantity to generate a new digital value.

For example for a Gray code on 3 bits, the successive digital values of Vin may correspond to the following codes: 000, 001, 011, 010, 110, 111, 101, 100.

If a pure binary coded output is required, a Gray code to pure binary code transcoder will be placed at the output of the CMP0 . . . CMPk comparators.

We will specify a practical example of circuits according to the invention, and particularly interpolation circuits.

Figure 6:
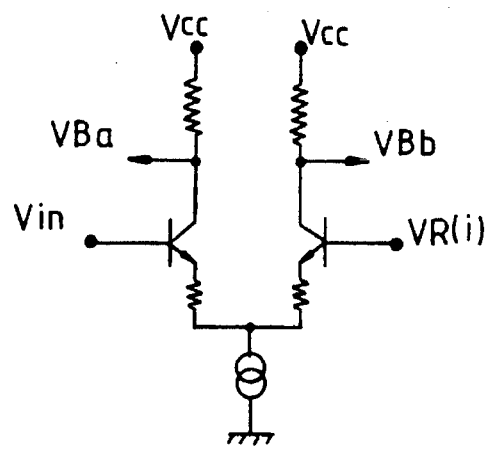
FIG. 6 shows a differential amplifier.

Firstly, FIG. 6 shows a schematic for practical construction of amplifier ADB (same schematic for ADA and ADC). This schematic shows that these amplifiers are classical differential amplifiers with two differential branches powered together by a constant current source and an input transistor (with or without emitter resistance) and a resistive load in each differential branch. Inputs are transistor bases, and outputs are collectors.

Figure 7:
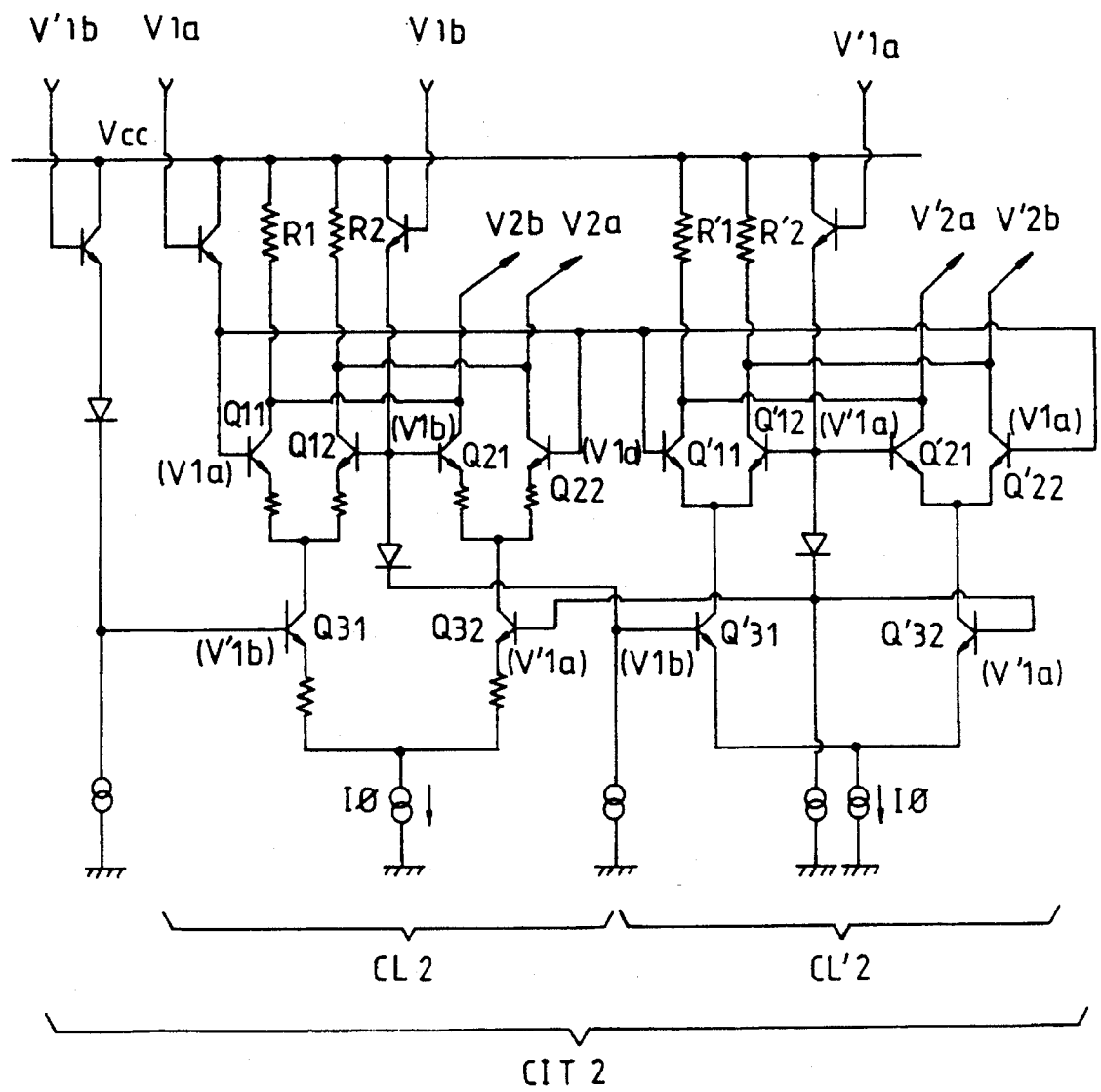
FIG. 7 shows a rank 2 interpolation circuit.

The analogue-digital converter in FIG. 7 shows the rank 2 CIT 2 interpolation circuit, or any circuit of rank k greater than 2.

Figure 8:
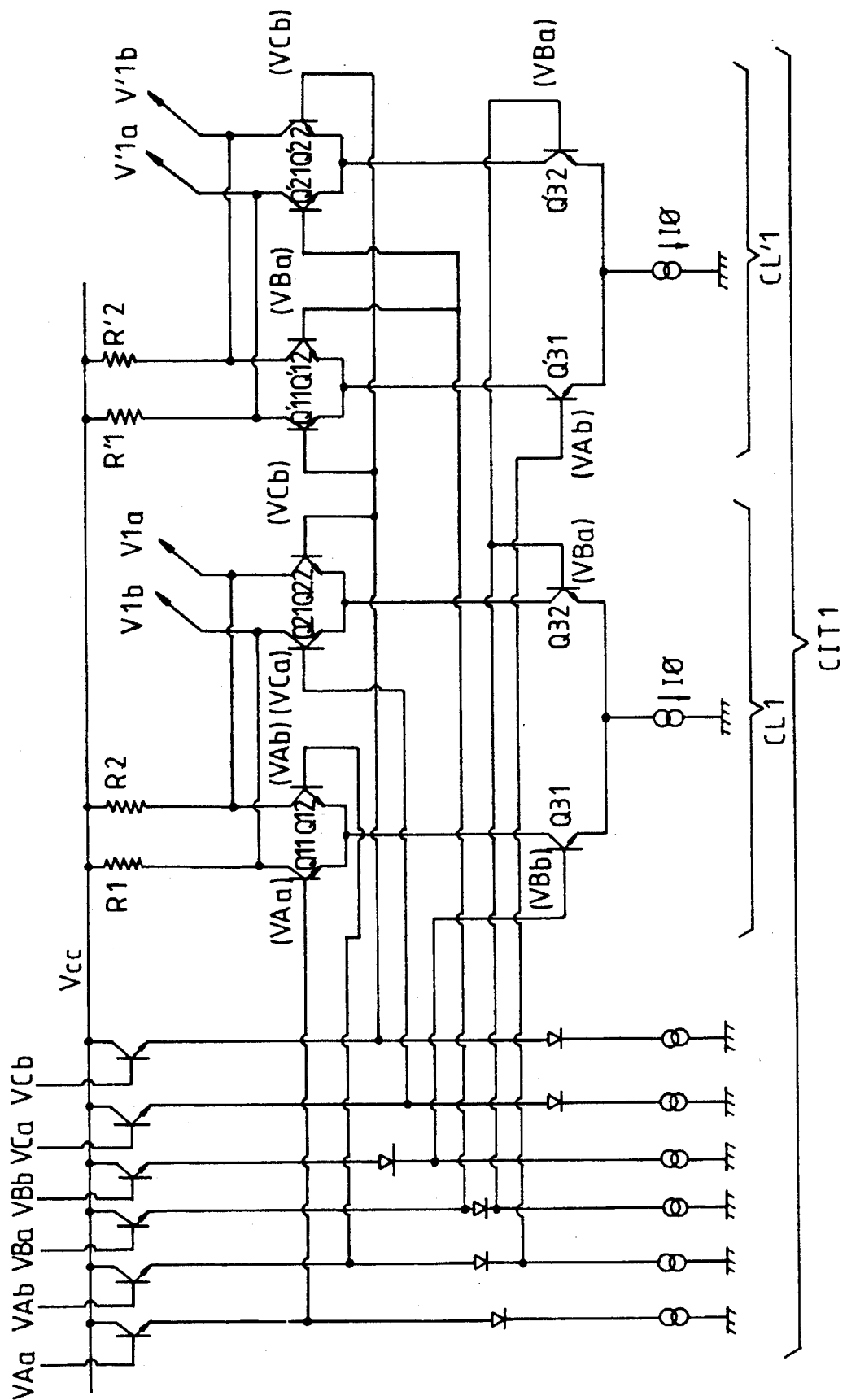
FIG. 8 represents a rank 1 interpolation circuit.

FIG. 8 shows the rank 1 interpolation circuit that is slightly different from the others since it has six inputs and not four like the others.

FIG. 7 shows that the circuit CIT2 consists essentially of two cells each with three pairs of differential branches. The first cell CL2 produces voltages V2a and V2b; the second cell CL'2 produces voltages V'2a and V'2b. Each differential branch conventionally includes at least one input transistor and a load. For the first two pairs, the loads are common; the first branch of the second pair is connected to the same load (R1) as the first branch of the second pair; similarly for the second branches of these two pairs connected to the same load R2.

The loads of the third pair of differential branches are composed respectively of the first pair and the second pair of branches. In other words the first differential pair is powered by the current from the first branch of the third pair, and the second pair is powered by the current from the other branch of the third pair.

Input transistors Q11 and Q12 of the first pair receive voltages V1a and V1b respectively on their base. These voltages are applied through transistors mounted in voltage followers for reasons of impedance matching. The voltage drop introduced by these followers is neutralized by installation symmetry. Input transistors Q21 and Q22 of the second pair receive the same voltages but crossed on their base, V1b and V1a. Input transistors Q31 and Q32 of the third pair receive signals V'1b and V'1a respectively. Level offset diodes are used conventionally such that potential references on the third branch are the same on the other two branches.

The third differential pair is powered by a constant current source.

Voltages sampled on transistor collectors Q12 and Q11 form the first two output signals V2a and V2b in circuit CIT2.

Note that input transistors in the various branches of cell CL2 include small emitter resistances (a few tens of ohms). They modify the gain of the stage and are designed to obtain signals V2a and V2b with the required amplitude variations as a function of Vin. These amplitude variations must be the same as those for signals V'2a and V'2b.

The second cell CL'2 is similar to cell CL2 except that it cannot include any emitter resistances; it also receives different input signals. Elements composing it are designated by references similar to those for cell CL2, with the "prime" symbol. The first differential pair receives voltages V1a and V1b on its input transistors Q'11 and Q'12. The second pair receives the same signals but crossed, V1b and V1a, on its input transistors Q'21 and Q'22. The third pair receives V1b on transistor Q'31 of the first branch and V2a on transistor Q'32 in the second branch. The supply current in the third branch is the same as for cell CL2.

FIG. 8 shows the first interpolation circuit CIT1. It is made very similar to circuit CIT2, with two cells CL1 and CL'1 to produce the pair of differential signals V1a, V1b, and V'1a and V'1b respectively, for which the variation as a function of Vin is 90° out of phase with pair V1a and V1b.

Cells CL1 and CL'1 are built in the same way as cell CL'2 in FIG. 7. Only the input signals applied to the bases of transistors in the differential branches are different.

For example, input signals for cell CL1 may be:

VAa and VAb for the first pair of differential branches,

VCa and VCb for the second,

VBb and VBa for the third.

For example, input signals for cell CL'1 may be:

VCb and VBa for the first pair,

VBa and VCb for the second,

VAb and VBa for the third.

Due to the similarity between cells CL1 and CL'1 with cell CL2 and CL'2, the same numeric references were used on FIG. 8 to designate the corresponding elements.

We will now show how the circuit in FIG. 1 can be used beneficially as a fine conversion circuit to obtain low order bits, in a converter that also includes coarse conversion means to obtain the high order bits.

Figure 9:
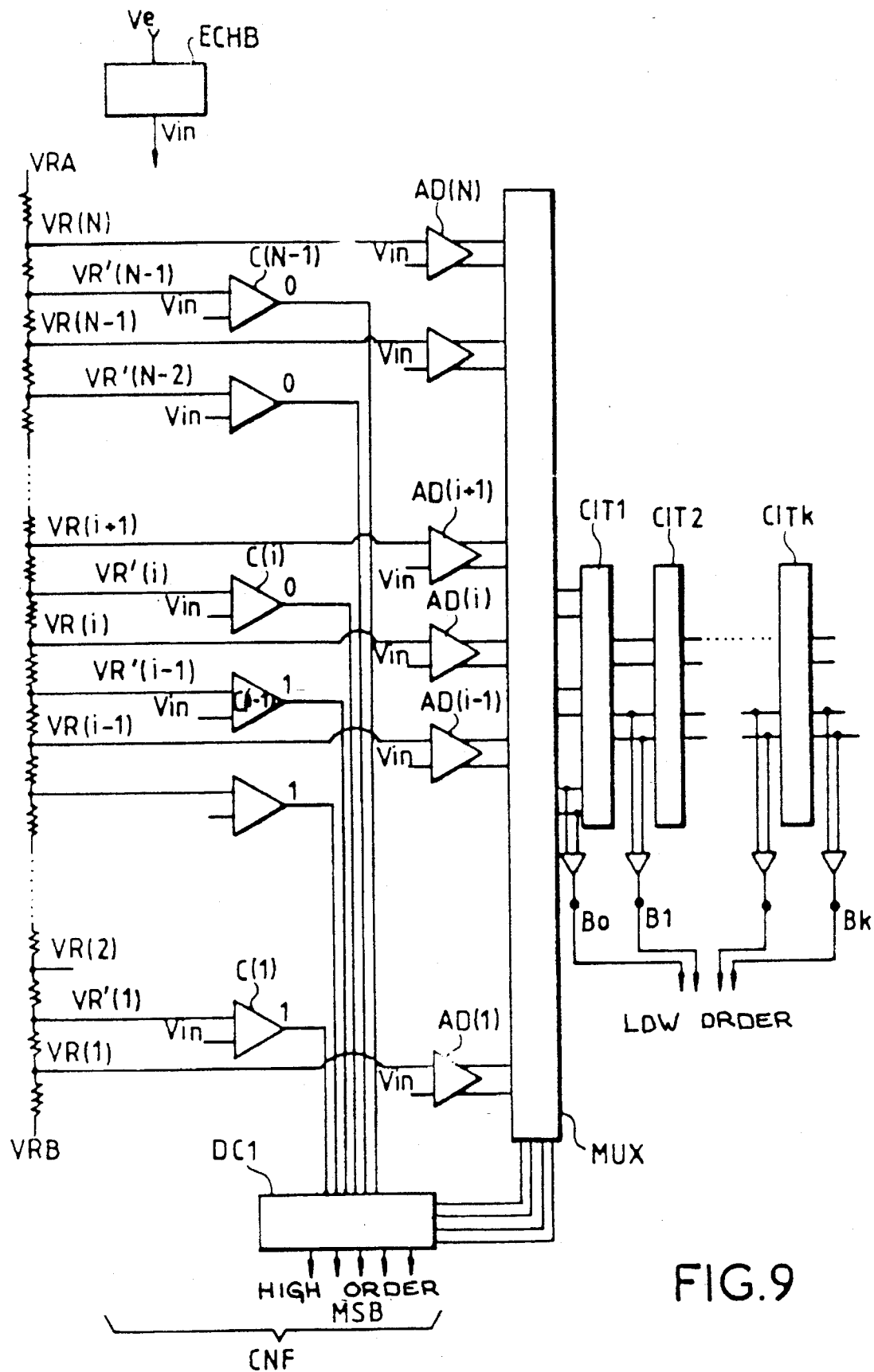
FIG. 9 represents a converter according to the invention, with selection of conversion sub-ranges.

FIG. 9 shows an example of the global architecture of this type of converter.

The converter includes a precision resistance bridge powered between two extreme reference voltages VRA and VRB. Intermediate points on this bridge define firstly N first equidistant voltage references VR(1) VR(2) ... VR(i) ... VR(N), and secondly N–1 second intermediate references VR'(1), VR'(2) ... VR'(i) ... VR'(N–1) between the first N references and preferably located at the mid-point of successive intervals between the first references. N is equal to 32 if five high order bits are required.

The N second references VR'(1) to VR'(N) are voltage references of a CNF flash analogue-digital converter that also receives the analogue input signal Vin to be converted. The flash converter is built using N–1 comparators C(1) to C(N–1) and a decoder DC1. The comparators output N logical outputs using a "thermometric" code, in other words if Vin is between VR'(i–1) and VR'(i), then the first i–1 comparators in the series provide a logical output at one level (for example 1) and all others provide a complementary state (zero). The decoder DC1 placed at the output of comparators C(1) to C(N–1) converts this code into a binary code representing the high order of the digital value of the analogue signal Vin.

The first N voltage references VR(1) to VR(N) are each applied to a first input of a corresponding differential amplifier AD(1) to AD(N) that receives the analogue voltage Vin on another input. Amplifiers are the type described with reference to FIG. 1, in other words amplifiers that output two symmetric voltages varying monotonically throughout the possible variation range of voltage Vin, these voltages being equal to a mean common value Vm when the difference between their input voltages cancels out. Differential amplifiers can therefore be conventional differential analogue amplifiers such as those in FIG. 6.

The input signal Vin applied to the input of the comparators and differential amplifiers is preferably the signal output from a blocking sampler ECHB like that shown in FIG. 1.

The logical signals output from the flash converter, in output from comparators C(1) to C(N–1) or in output from decoder DC1, are used not only to supply high order bits of the conversion, but also to select three adjacent differential amplifiers AD(i–1), AD(i), AD(i+1), for which the voltage references VR(i–1), VR(i), VR(i+1) are closest to the coarse coding value obtained for Vin.

If Vin is between VR'(i–1) and VR'(i) (that are located at mid-distance between VR(i–1) and VR(i), and between VR(i) and VR(i+1) respectively), then the three amplifiers AD(i–1), AD(i), AD(i+1) that receive input references VR(i–1), VR(i), VR(i+1) are selected. The outputs from these three amplifiers are then connected through an analogue multiplexer MUX to a first interpolation circuit CIT1 which is shown in FIGS. 1 and 8. The multiplexor is controlled by the outputs of decoder DC 1 or the outputs of comparators C(1) to C(N–1). Outputs from the other amplifiers are not used.

The outputs from circuit CIT1 are connected to the next interpolation circuit CIT2, that itself is connected to a third circuit, etc. We therefore have a cascade of k interpolation circuits CIT2, ... CITk (for example k=5 to obtain seven low order bits), as shown in the schematic in FIG. 1. Comparators such as comparators CMP0 to CMPk in FIG. 1, placed in the input or output to interpolation circuits CIT1 to CITk output the low order bits B0 to Bk of the conversion.

Consequently the flash converter CNF built using comparators C(1) to C(N–1) outputs a digital value representing the position of Vin with respect to voltage references VR'(1) to VR'(N–1), and this converter therefore indicates a triplet of reference values VR(i–1), VR(i), VR(i+1) between which Vin is located. The converter with successive interpolations CIT1, CIT2, ... CITk outputs the most precise position of Vin inside this triplet, in digital form.

The low order bits and high order bits are added in an adder not shown in order to end up with a global digital value of Vin.

Note that the same resistance bridge is used for the coarse conversion (high order) of Vin and the fine conversion (low order) of the residue.

Note also that the voltage references VR'(1) to VR'(N–1) chosen for comparators C(1) to C(N–1) were different to those chosen for the amplifier references VR(1) to VR(N). This is not compulsory but it does give an overlap between the high order conversion and the low order conversion in order to avoid conversion errors when Vin is close to reference values. Voltages VR'(i) are preferably exactly at the mid-points of the intervals between voltages VR(i).

More precisely, we can say that the voltage difference between VR(i−1) and VR(i) represents the high order bit of the fine conversion, in other words the highest order bit B0 in the low order bits. The voltage difference between VR°(i−1) and VR'(i) represents a low order bit of the coarse conversion that must be identical to bit B0. The difference between VR(i−1) and VR'(i−1) represents half of a low order bit of the coarse conversion and forms the downside overlap of the measurement; similarly the difference between VR'(i) and VR(i+1) represents half of a low order bit of the coarse conversion and forms the upside overlap.

Under these conditions, if Vin is between VR'(i−1) and VR'(i) but is very close to VR'(i−1) for example, leading to the risk that amplifiers AD(i−2), AD(i−1) and AD(i) are selected instead of AD(i−1), AD(i) and AD(i+1), then Vin is a long way from VR(i−1) and VR(i) and the fine conversion will output a value that will ambiguously take account of the amplifier selection that was made. A simple addition of low order bits and high order bits (with their respective weights) will therefore, due to the use of a common resistance bridge and an overlap between the values of reference voltages, produce a correct value of Vin regardless of its position with respect to reference voltages. This is impossible in many mixed architecture converters.

In the architecture shown in FIG. 9, N amplifiers AD(1) or AD(N) are shown, the outputs of which are connected to a 2N inputs of a multiplexer that can transmit three pairs of signals to circuit CIT1. But the multiplexor could also have N inputs and three outputs and be placed immediately at the output from the resistance bridge in order to select three reference voltages VR(i−1), VR(i), VR(i+1) and transmit them to the input of the three amplifiers ADC, ADB, ADA, such as those shown in FIG. 1. In this case there are not N amplifiers from which three are chosen, and there will only be three amplifiers receiving three reference voltages selected from N. However this assumes that the multiplexer is capable of transmitting the selected reference voltages to its output, without changing them.

We claim:

1. Analogue-digital converter with one input to receive an analogue voltage Vin to be converted, wherein it comprises three main reference voltages VR(i−1), VR(i), VR(i+1) and three differential amplifiers (ADA, ADB, ADC), each receiving on their first input, the voltage to be converted Vin variable between two extreme values Vext1 and Vext2 outside the interval between the main reference voltages, each of the amplifiers receiving one of the main reference voltages on second input, each amplifier supplying two output voltages (VAa, VAb; VBa, VBb; VCa, VCb) that vary symmetrically as a function of the voltage Vin, almost linearly about an average value Vm that is identical for the three amplifiers and that is obtained as an amplifier output when voltages on the two inputs of this amplifier are equal, the output voltages varying monotonically as a function of Vin for values of Vin between the extreme values Vext1 and Vext2, the converter also including a first interpolation circuit (CIT1) receiving the six amplifier output voltages and supplying four rank 1 interpolation voltages (V1a, V1b, V'1a, V'1b), variable as a function of Vin, according to a function that is near-sinusoidal for values of Vin between the main reference voltages, identical in amplitude for the four voltages but is out of phase, and representing a single sine period, the four interpolation voltages varying inversely in pairs, two of them (V1a, V1b) o passing through an average value and one of the two others (V'1a, V'1b) with a maximum and the other with a minimum when the voltage Vin is equal to any one of the three main reference voltages.

2. Converter according to claim 1, wherein a rank 0 comparator (CMP0) receives outputs (VBa, VBb) from the differential amplifier (ADB) connected to the main reference voltage VR(i) and outputs a high order bit (B0) of the conversion of Vin.

3. Converter according to any one of claims 1 or 2, wherein a rank 1 comparator (CMP1) receives the two voltages in phase opposition (V'1a, V'1b) from the first interpolation circuit (CIT1), that pass through a maximum or a minimum when Vin is equal to the main reference voltages VR(i−1), VR(i), VR(i+1), this comparator outputting a rank 1 bit (B1) of the conversion of Vin.

4. Converter according to any one of claims 1 or 2, wherein it comprises at least one rank k (k>1) interpolation circuit (CITk) receiving four voltages output from a rank k−1 interpolation circuit, and supplying four rank k interpolation voltages (Vka, Vkb, V'ka, V'kb), variable as a function of the amplitude of the signal Vin to be converted, according to a function that, for values of Vin between the main reference voltages, is near-sinusoidal, identical in amplitude for the four signals except for the phase, and representing $2^{k-1}$ sine periods; the four rank k interpolation voltages varying inversely in pairs; two of them (V'ka, V'kb) passing through a common average value when the voltage Vin to be converted is equal to "rank k intermediate voltages", and one of them passing through a maximum and the other passing through a minimum when the voltage Vin to be converted is equal to the main reference voltage and intermediate reference voltages rank 1 to k−1; the other two rank k interpolation voltages (Vka, Vkb) pass through a common average value when the voltage Vin is equal to a main reference voltage or a rank 1 to k−1 intermediate voltage.

5. Converter according to claim 4, wherein it comprises a rank k comparator (CMPk) receiving the two voltages (V'ka, V'kb) from the rank k interpolation circuit in phase opposition, passing through a maximum or a minimum when Vin is equal to the main reference voltages or rank 1 to k−1 intermediate reference voltages, this comparator outputting a rank k bit of the conversion of Vin.

6. Analogue-digital converter, including a coarse converter (CNF) for obtaining high order bits of the conversion, and a fine converter for obtaining low order bits, wherein the fine converter includes a structure according to any one of claims 1 or 2.

7. Converter according to claim 6, wherein the coarse converter (CNF) is a flash converter using a resistance bridge and N comparators, and the fine converter uses three of the voltages supplied by this bridge as reference voltages VR(i−1), VR(i), VR(i+1), these voltages being selected by the coarse converter such that the analogue voltage Vin to be converted is located between these three reference voltages.

8. Converter according to claim 7, wherein the resistance bridge comprises 2N resistances with intermediate taps connected alternatively to the coarse converter comparators and to the differential amplifiers of the fine converter.

9. Converter according to claim 8, wherein it contains N differential amplifiers connected to N intermediate taps distributed on the resistance bridge, the outputs of these amplifiers being connected through a multiplexor controlled by the coarse converter to the six inputs of the first interpolation circuit (CIT1).

10. Converter according to claim 3 wherein, for each group of two interpolation voltages to be produced, varying symmetrically and inversely, each interpolation circuit comprises one cell with three pairs of differential branches, each branch including at least one load and an input transistor for which the control electrode forms a signal input for this branch; the two symmetric branches of the first pair are powered by the current from the first branch of the third pair and together form the load for this first branch; the two branches of the second pair are powered by the current in the second branch of the third pair and together form the load for the second branch; the first branches of the first and second pairs have a common load, the second branches of the first and second pairs also have a common load symmetric to the other load.

11. Converter according to claim 10, wherein a rank k interpolation circuit (k>1) contains two interpolation cells (CL2, CL'2), with input signals applied to the first cell (CL2) being:

the first two rank k−1 interpolation signals (V1$a$, V1$b$) varying in phase opposition as a function of Vin, applied as inputs to the first differential pair (Q11, Q12), these same signals, crossed, applied to the second differential pair (Q21, Q22), the other two rank k−1 interpolation signals (V'1$b$, V'1$a$) applied to the third differential pair, and input signals applied to the second cell (CL'2) being:

a first and second rank k−1 interpolation signal (V1$a$, V'1$a$) varying 90° out of phase with Vin, applied to the inputs of the first differential pair (Q'11, Q'12), the same signals but crossed, applied to the inputs of the second differential pair (Q'21, Q'22), a third rank k−1 interpolation signal (V1$b$) varying in phase opposition with the first (V1$a$), is applied to an input (Q'31) of the third differential pair, the second rank k−1 interpolation signal (V'1$a$) being applied to the other input (Q'32) of the third pair.

12. Converter according to claim 3, wherein the rank 1 interpolation circuit includes two interpolation cells (CL1, CL'1) and wherein:

the first cell (CL1) receives:

on the first differential pair (Q11, Q12), the output signals (VAa, VAb) from the first differential amplifier (ADA), varying in phase opposition to Vin, and cancelling out when Vin is equal to the first main reference voltage VR(i−1);

on the second differential pair (Q21, Q22), the output signals (Vca, Vcb) from the third amplifier (ADC), varying in phase opposition and cancelling out when Vin is equal to the third main reference voltage VR(i+1);

on the third differential pair (Q31, Q32), the output signals from the second amplifier (ADB) also varying in phase opposition and cancelling out for the second voltage reference VR(i).

and the second cell (CL'1) receives:

on the first differential pair (Q'11, Q'12), an output (VCb) from the third amplifier and an output (VBa) from the second, on the second differential pair (Q'21, Q'22), the same signals but crossed, on the third pair (Q'31, Q'32), firstly an output (VAb) from the first amplifier and also an output (VBa) from the second.

* * * * *